(12) United States Patent
Kawanami

(10) Patent No.: US 7,672,067 B2
(45) Date of Patent: Mar. 2, 2010

(54) OPTICAL DEVICE, EXPOSURE APPARATUS, AND DEVICE MANUFACTURING METHOD

(75) Inventor: Kentarou Kawanami, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/146,571

(22) Filed: Jun. 26, 2008

(65) Prior Publication Data

US 2009/0002674 A1   Jan. 1, 2009

(30) Foreign Application Priority Data

Jun. 28, 2007   (JP) .............................. 2007-171225

(51) Int. Cl.
G02B 7/02   (2006.01)

(52) U.S. Cl. ...................... 359/811; 359/813

(58) Field of Classification Search ................ 359/811, 359/813, 814, 817, 819, 821, 822, 823
See application file for complete search history.

(56) References Cited

U.S. PATENT DOCUMENTS 6,686,989 B2 * 2/2004 Hagiwara et al. ............. 355/30

| | | | |
|---|---|---|---|
| 6,867,848 B2 * | 3/2005 | Ebinuma et al. | 355/75 |
| 7,493,031 B2 * | 2/2009 | Yu | 396/72 |
| 7,495,845 B2 * | 2/2009 | Asami | 359/753 |
| 2005/0153064 A1 | 7/2005 | Lipson | |

FOREIGN PATENT DOCUMENTS

| JP | 10-010394 A | 1/1998 |
|---|---|---|
| JP | 11-014876 A | 1/1999 |
| JP | 2001-242364 A | 9/2001 |
| JP | 2005-203795 A | 7/2005 |

* cited by examiner

*Primary Examiner*—Timothy J Thompson
(74) *Attorney, Agent, or Firm*—Canon U.S.A., Inc. I.P. Division

(57) ABSTRACT

This invention effectively limits light incidence on an adhesive material fixing an optical element. An optical device includes an optical element, a supporting member connected to the optical element through an adhesive material to support the optical element, and a light shielding film formed in an unirradiated region on the surface of the optical element to limit light incidence on the adhesive material.

6 Claims, 4 Drawing Sheets

US 7,672,067 B2

OPTICAL DEVICE, EXPOSURE APPARATUS, AND DEVICE MANUFACTURING METHOD

BACKGROUND OF THE INVENTION

1. Field of the Invention

The present invention relates to an optical device, an exposure apparatus including the optical device, and a device manufacturing method using the exposure apparatus.

2. Description of the Related Art

An exposure apparatus is used in lithography for manufacturing a device such as a semiconductor device. The exposure apparatus illuminates an original by an illumination optical system, and projects the pattern of the original onto a substrate via a projection optical system, thereby exposing the substrate. An adhesive material is used to fix an optical element on a supporting member in an optical system such as an illumination optical system and projection optical system.

FIGS. 2 and 3 schematically show a partial arrangement of an optical system such as an illumination optical system and projection optical system of an exposure apparatus. An optical element (e.g., a lens or mirror) 2 of the optical system is used while being fixed on an annular supporting member 3. The side portion of the optical element 2 is fixed on the supporting member 3 through an adhesive material 1 (see Japanese Patent Laid-Open No. 2001-242364).

Upon irradiating the optical element of the optical device of the exposure apparatus, light enters positions other than a light propagation portion, which is determined based on the numerical aperture and the angle of view of the optical element, due to diffraction and scattering. For example, as schematically shown in FIG. 3, light which has entered the optical element 2 often reaches the adhesive material 1 upon being transmitted through the optical element 2 and reflected by the supporting member 3. Upon being irradiated with light (typically, ultraviolet rays), the adhesive material connecting the optical element to the supporting member deteriorates, which can result in a decrease in adhesive force and a change in elastic force. This can change the position, orientation, and shape of the optical element, and can therefore decrease the performance of the optical system.

SUMMARY OF THE INVENTION

The present invention has been made in consideration of the above-described problem, and has as its object to more effectively limit light incidence on, e.g., an adhesive material fixing an optical element.

According to the first aspect of the present invention, there is provided an optical device comprising an optical element, a supporting member connected to the optical element through an adhesive material to support the optical element, and a light shielding film formed in an unirradiated region on a surface of the optical element to limit light incidence on the adhesive material.

According to the second aspect of the present invention, there is provided an optical device comprising an optical element, a supporting member connected to the optical element through an adhesive material to support the optical element, and an incidence limiting portion configured to limit light incidence on the adhesive material, the supporting member including a first supporting portion connected to at least a part of a side portion of the optical element through the adhesive material, and a second supporting portion configured to support a peripheral portion of the optical element from below, wherein the incidence limiting portion is located between a first contact portion and a second contact portion, the adhesive material contacting the first supporting portion at the first contact portion and the optical element contacting the second supporting portion at the second contact portion.

According to the present invention, it is possible to more effectively limit light incidence on, e.g., an adhesive material fixing an optical element.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
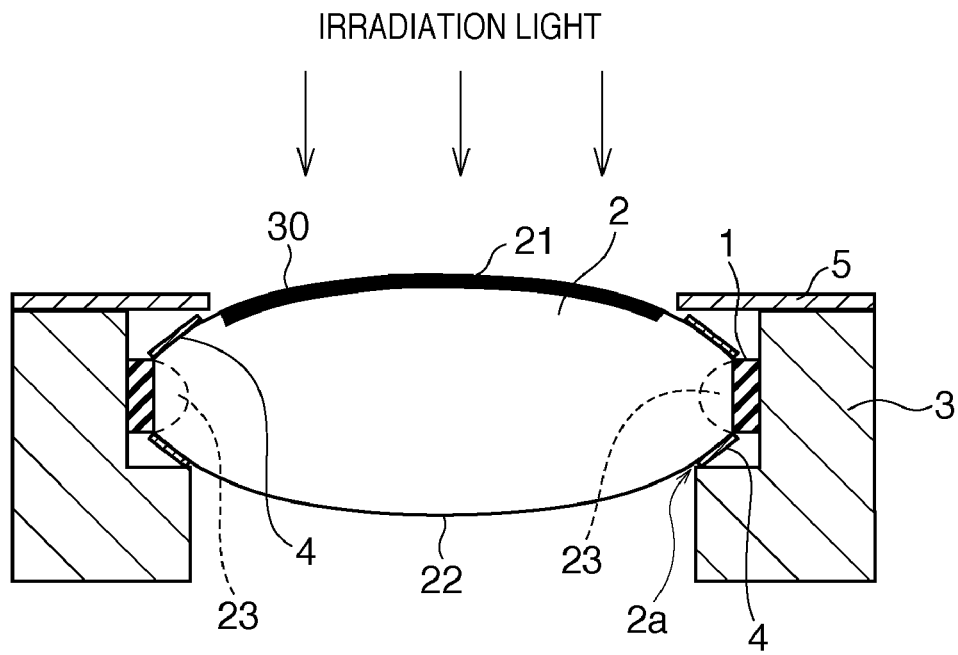
FIG. 1 shows the schematic arrangement of an optical device according to the first embodiment of the present invention.
Figure 2:
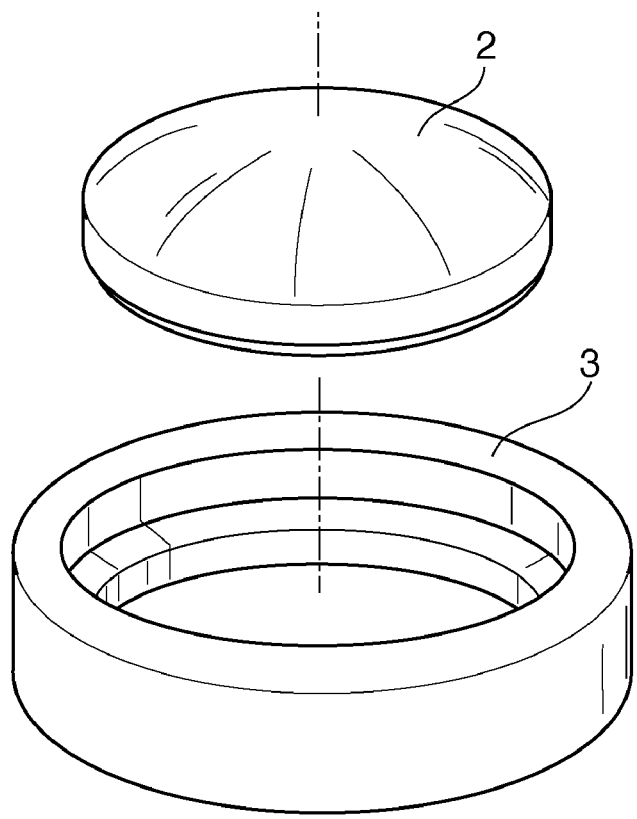
FIG. 2 schematically shows a partial arrangement of an optical system such as an illumination optical system and projection optical system of an exposure apparatus.

FIG. 1 shows the schematic arrangement of an optical device according to the first embodiment of the present invention. The optical device according to the first embodiment comprises an optical element 2, a supporting member 3 which is connected to a part 23 of the optical element 2 through an adhesive material 1 and supports the optical element 2, and a light shielding film 4 formed on the surface of the optical element 2 to limit light incidence on the adhesive material 1.

An example of the optical element 2 is a lens. The part 23 of the optical element 2 is typically at least a part of the side portion of the optical element 2. The light shielding film 4 can be formed on the surface of the optical element 2 by, e.g., coating. Referring to FIG. 1, irradiation light enters the optical element 2 from its upper surface side (to be referred to as an object side hereinafter). The irradiation light irradiates an irradiated region 30 on an object side surface 21 of the optical element 2. The irradiated region 30 is a light propagation region determined based on the numerical aperture and the angle of view of the optical element 2 in designing an optical system including the optical element 2. A region other than the irradiated region 30 on the object side surface 21 is an unirradiated region. The optical element 2 has the object side surface 21 and an image side surface 22 opposite to the object side surface 21. The light shielding film 4 can be formed in at least one of the peripheral portion of the object side surface 21 and that of the image side surface 22, which are unirradiated regions. The unirradiated region herein includes a peripheral portion close to the side edge of the optical element 2. The optical element 2 may be irradiated from its lower surface.

Figure 3:
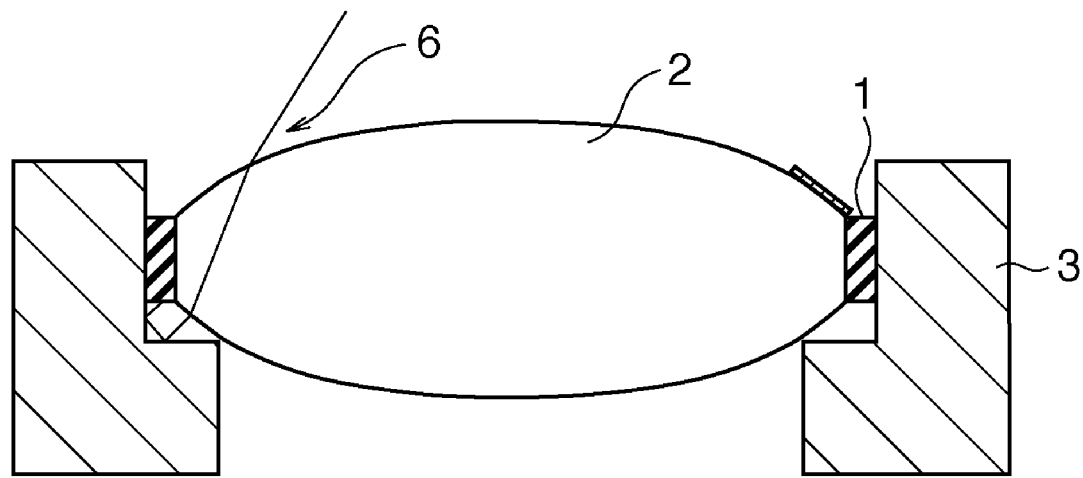
FIG. 3 schematically shows the partial arrangement of the optical system such as the illumination optical system and projection optical system of the exposure apparatus.

By forming the light shielding films 4 in portions (unirradiated regions) of the surfaces (surfaces 21 and 22) of the optical element 2, a light beam 6 shown in FIG. 3 is prevented from entering the adhesive material 1. This makes it possible to prevent any change in the physical properties of the adhesive material 1 and even any changes in the position, orientation, and shape of the optical element 2.

The light shielding film 4 can be made of, e.g., a resin containing a pigment or a material containing Ni or Si. The light shielding film 4 is preferably made of, e.g., a material with a transmittance and a reflectance of 0.1% or less.

When regions, in which the light shielding films 4 are to be formed, on the surfaces (surfaces 21 and 22) of the optical element 2 are formed into diffusing surfaces (i.e., frosted glass-like uneven surfaces), it is easy to uniformly coat the optical element 2 with a light shielding material. To prevent the light shielding film 4 from being, e.g., damaged and scattered as it comes into contact with the supporting member 3, the light shielding film 4 is preferably not formed in a contact portion 2a between the optical element 2 and the supporting member 3.

A light shielding member 5 can be fixed on the supporting member 3. The light shielding member 5 limits light which enters the optical element 2 and thereby limits a light component which enters the adhesive material 1 so that no unnecessary light component (i.e., a light component which scatters outside the irradiation region) enters the optical element 2. For example, the light shielding member 5 shields an irradiation light component which directly enters the adhesive material 1 without being transmitted through the optical element 2. For this purpose, the light shielding member 5 extends more inwards than the position of the adhesive material 1, as shown in FIG. 1.

Second Embodiment

Figure 4:
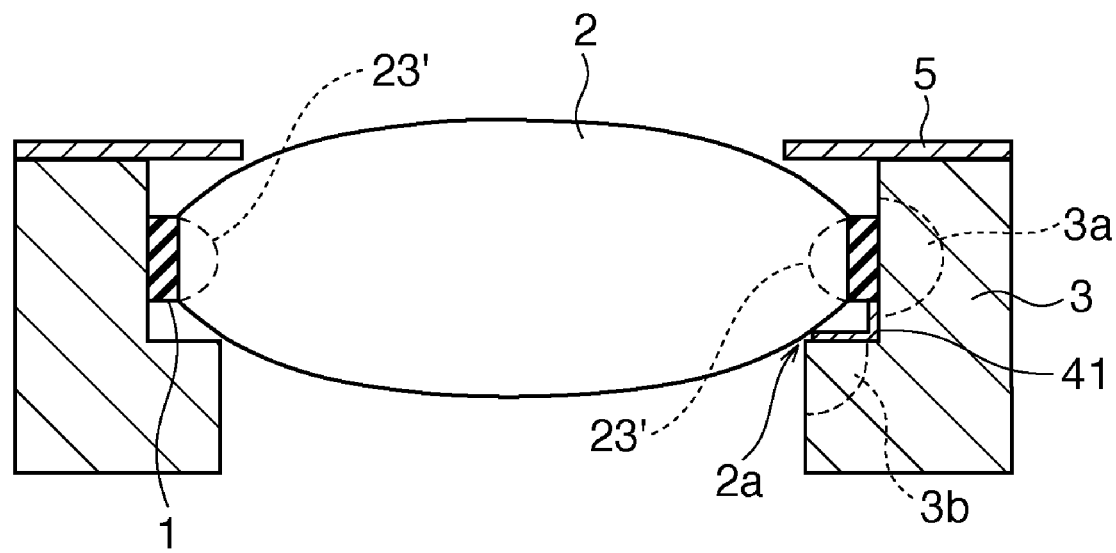
FIG. 4 shows the schematic arrangement of an optical device according to the second embodiment of the present invention.

FIG. 4 shows the schematic arrangement of an optical device according to the second embodiment of the present invention. The optical device according to the second embodiment comprises an optical element 2, a supporting member 3 which is connected to at least a part 23' of the side portion of the optical element 2 through an adhesive material 1 and supports the optical element 2, and an incidence limiting portion 41 which limits light incidence on the adhesive material 1. An example of the optical element 2 is a lens.

The supporting member 3 comprises a first supporting portion 3a which is connected to at least the part 23' of the side portion of the optical element 2 through the adhesive material 1, and a second supporting portion 3b which supports the peripheral portion of the optical element 2 from below. The incidence limiting portion 41 is inserted between the contact portion between the adhesive material 1 and the first supporting portion 3a and a contact portion 2a between the optical element 2 and the second supporting portion 3b.

Referring to FIG. 3, a light beam 6 reaches the adhesive material 1 upon being transmitted through the optical element 2 and reflected by the supporting member 3. In the second embodiment, the incidence limiting portion 41 prevents the light beam 6 from entering the adhesive material 1. This makes it possible to prevent any changes in the position, orientation, and shape of the optical element 2. The incidence limiting portion 41 herein is a light absorbing member, which is preferably made of, e.g., a material with a transmittance and a reflectance of 0.1% or less. The same applies to the members of incidence limiting portions in the following embodiments.

Third Embodiment

Figure 5:
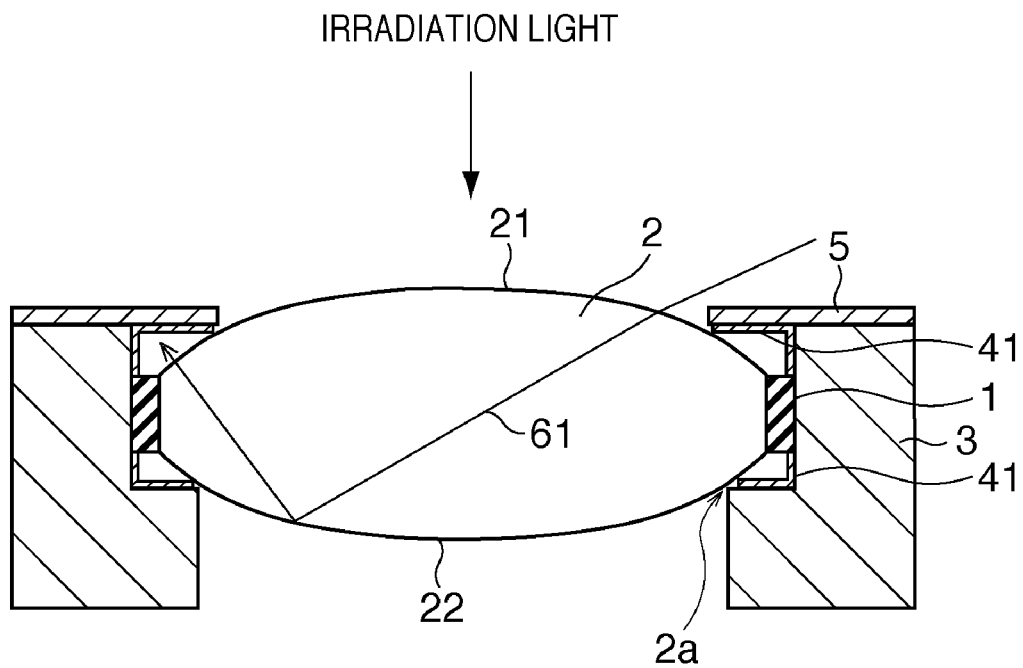
FIG. 5 shows the schematic arrangement of an optical device according to the third embodiment of the present invention.

FIG. 5 shows the schematic arrangement of an optical device according to the third embodiment of the present invention. The third embodiment is different from the second embodiment in that an incidence limiting portion 41 is additionally provided on a side opposite to a second supporting portion 3b with respect to an adhesive material 1. A description of the same parts as those in the above-described embodiments will not be repeated. As shown in FIG. 5, a light beam 61 which has been generated by scattered light and has entered an optical element 2 can enter the adhesive material 1 upon being reflected by an image side surface 22 of the optical element 2 and further reflected by a light shielding member 5. To avoid this situation, the incidence limiting portions 41 are provided on the surface of the light shielding member 5 on the side of the adhesive material 1 and on the surface of a supporting member 3 from the adhesive material 1 to the light shielding member 5, as shown in FIG. 5. This arrangement can prevent light incidence on the adhesive material 1 from its upper surface. This makes it possible to prevent any changes in the position, orientation, and shape of the optical element 2. The light shielding member 5 itself may serve as the incidence limiting portion 41. This obviates the need to provide the incidence limiting portion 41 on the lower surface (the surface of the light shielding member 5 on the side of the adhesive material 1) of the light shielding member 5.

As shown in FIG. 1, a light shielding film 4 formed in the unirradiated region on the optical element 2 is also applicable to the optical element according to this embodiment. Providing both the light shielding film 4 and incidence limiting portions 41 makes it possible to more effectively prevent light incidence on the adhesive material 1.

Fourth Embodiment

Figure 6:
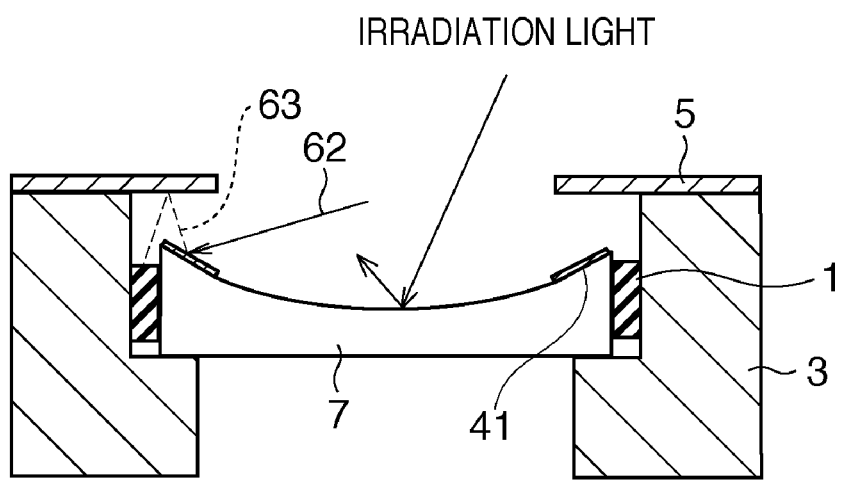
FIG. 6 shows the schematic arrangement of an optical device according to the fourth embodiment of the present invention.

FIG. 6 shows the schematic arrangement of an optical device according to the fourth embodiment of the present invention. In this embodiment, an optical element is not a lens but a mirror. A description of the same parts as those in the above-described embodiments will not be repeated. A mirror 7 reflects incident light (irradiation light) and guides it to a mirror or lens on the subsequent stage. As shown in FIG. 6, a light beam 62 which has been generated by scattered light and has entered the unirradiated region on the mirror 7 can enter an adhesive material 1 upon being reflected by the mirror surface and further reflected by a light shielding member 5. To avoid this situation, an incidence limiting portion 41 is provided in the peripheral portion of the surface of the mirror 7, which is an unirradiated region. This prevents the light beam 62 from being reflected by the light shielding member 5 as indicated by a dotted line 63 and therefore prevents the light beam 62 from entering the adhesive material 1. This makes it possible to prevent any changes in the position, orientation, and shape of an optical element 2.

As in FIG. 5, when the incidence limiting portions 41 are provided on the surface of the light shielding member 5 on the side of the adhesive material 1 and on the surface of a supporting member 3 from the upper surface of the adhesive material 1 to the light shielding member 5, it is possible to more effectively limit light incidence on the adhesive material 1. The light shielding member 5 itself may serve as the incidence limiting portion 41. This obviates the need to provide the incidence limiting portion 41 on the lower surface (the surface of the light shielding member 5 on the side of the adhesive material 1) of the light shielding member 5.

Fifth Embodiment

Figure 7:
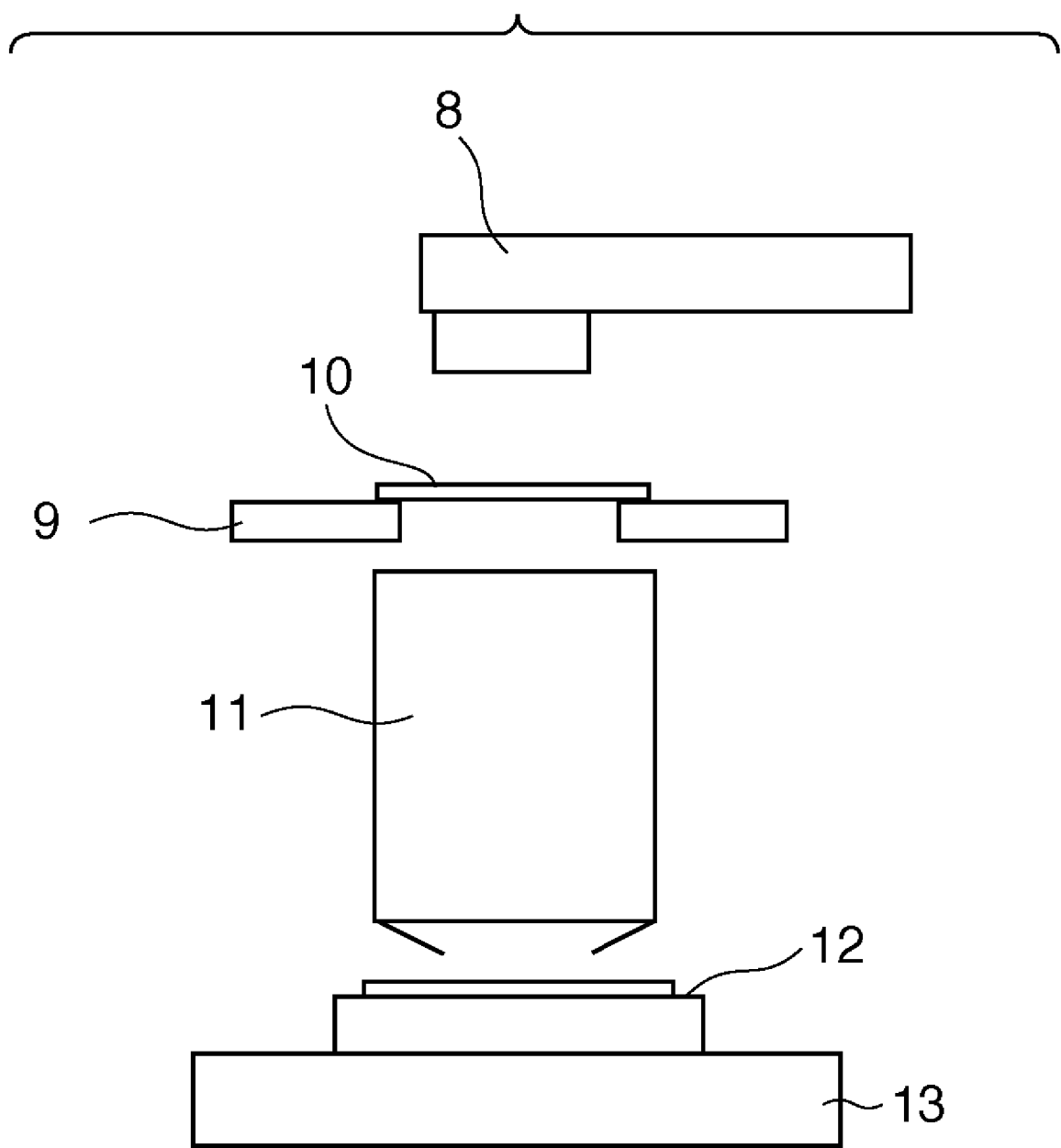
FIG. 7 shows the schematic arrangement of an exposure apparatus according to the fifth embodiment of the present invention.

FIG. 7 shows the schematic arrangement of an exposure apparatus according to the fifth embodiment of the present invention. The exposure apparatus according to the fifth embodiment illuminates an original (reticle) 10 by an illumination optical system 8, and projects the pattern of the original 10 onto a substrate (wafer) 12 via a projection optical system 11, thereby exposing the substrate 12. An original stage mechanism 9 aligns the original 10. A substrate stage mechanism 13 aligns the substrate 12.

At least one of the illumination optical system 8 and the projection optical system 11 can include the optical device explained in each of the first to fourth embodiments. This arrangement can limit light incidence on an adhesive material connecting an optical element to a supporting member. This makes it possible to prevent any change in the physical properties of an adhesive material 1 and even any changes in the position, orientation, and shape of an optical element 2.

Sixth Embodiment

A device manufacturing method using the above-described exposure apparatus will be explained next. A device manufacturing method according to a preferred embodiment of the present invention is suitable to manufacture, e.g., a semiconductor device and liquid crystal device. This method can include steps of transferring the pattern of an original onto a photosensitive agent applied on a substrate using the above-described exposure apparatus, and developing the photosensitive agent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-171225, filed Jun. 28, 2007, which is hereby incorporated by reference herein in its entirety.

What is claimed is:

1. An optical device comprising:
   an optical element;
   a supporting member connected to the optical element through an adhesive material to support the optical element; and
   an incidence limiting portion configured to limit light incidence on the adhesive material,
   the supporting member including a first supporting portion connected to at least a part of a side portion of the optical element through the adhesive material, and a second supporting portion configured to support a peripheral portion of the optical element from below,
   wherein the incidence limiting portion is located between a first contact portion and a second contact portion, the adhesive material contacting the first supporting portion at the first contact portion and the optical element contacting the second supporting portion at the second contact portion.

2. The device according to claim 1, wherein the incidence limiting portion includes a light absorbing member.

3. The device according to claim 1, further comprising a light shielding film formed in an unirradiated region on a surface of the optical element to limit light incidence on the adhesive material.

4. The device according to claim 1, wherein the incidence limiting portion configured to limit light incidence on the adhesive material is provided on a side opposite to the second supporting portion with respect to the adhesive material.

5. An exposure apparatus which illuminates an original by an illumination optical system, and projects a pattern of the original onto a substrate via a projection optical system to expose the substrate, wherein
   at least one of the illumination optical system and the projection optical system includes an optical device defined in claim 1.

6. A device manufacturing method comprising the steps of:
   exposing a substrate using an exposure apparatus defined in claim 5, and
   developing the exposed substrate.

* * * * *